United States Patent

Matsuo et al.

[11] Patent Number: 5,885,498
[45] Date of Patent: Mar. 23, 1999

[54] ORGANIC LIGHT EMITTING DEVICE AND METHOD FOR PRODUCING THE SAME

[75] Inventors: Mikiko Matsuo, Nara; Ritsuo Inaba, Osaka, both of Japan

[73] Assignee: Matsushita Electric Industrial Co., Ltd., Japan

[21] Appl. No.: 988,387

[22] Filed: Dec. 10, 1997

[30] Foreign Application Priority Data

Dec. 11, 1996 [JP] Japan ................................. 8-330525

[51] Int. Cl.$^6$ .............................. G02F 1/00; C09K 11/06; H01J 1/62
[52] U.S. Cl. ...................... 252/583; 252/301.16; 313/504
[58] Field of Search .................................. 252/583, 500, 252/301.16; 313/504

[56] References Cited

U.S. PATENT DOCUMENTS

| | | | |
|---|---|---|---|
| 3,906,283 | 9/1975 | Bard et al. | 252/583 |
| 4,720,432 | 1/1988 | Van Slyke et al. | 252/301.16 |
| 5,059,863 | 10/1991 | Tashiro et al. | 313/504 |
| 5,061,569 | 10/1991 | Van Slyke | 252/301.16 |
| 5,150,006 | 9/1992 | Van Slyke et al. | 313/504 |
| 5,151,629 | 9/1992 | Van Slyke | 313/504 |
| 5,645,948 | 7/1997 | Shi et al. | 313/504 |
| 5,707,747 | 1/1998 | Tomiyama et al. | 313/504 |
| 5,755,999 | 5/1998 | Shi et al. | 252/301.16 |

FOREIGN PATENT DOCUMENTS

| | | |
|---|---|---|
| 2-289676 | 11/1990 | Japan . |
| 7-53955 | 2/1995 | Japan . |
| 7-126615 | 5/1995 | Japan . |
| 7-316549 | 12/1995 | Japan . |
| 8-48656 | 2/1996 | Japan . |
| 8-231951 | 9/1996 | Japan . |
| 8-259934 | 10/1996 | Japan . |
| 9-22782 | 1/1997 | Japan . |

*Primary Examiner*—Philip Tucker
*Attorney, Agent, or Firm*—Wenderoth, Lind & Ponack, L.L.P.

[57] ABSTRACT

The present invention is to provide a organic light emitting device with high efficiency and long life of emitting light. The light emitting device comprises a positive electrode, a hole transporting layer, an electron transporting layer and a negative electrode on a substrate, the hole transporting layer if formed of triphenylamine tetramer as the major component, and 5,6,11,12-tetraphenylnaphthacene or 9,10-diphenylanthracene is added in a amount of 0.1–10% in the hole transporting layer. The hole transporting layer acts as a light emitting layer and suppressing reduction of luminance of the light and prevent the black spots from occurring and expanding so as to extend the life time. Furthermore, in the present invention, the transparent positive electrode is composed from two-layer structure comprising a hole injecting layer and a current distributing layer, this restricting occurrence of the black spots and reduction of the luminance due to the positive electrode.

4 Claims, 2 Drawing Sheets

ORGANIC LIGHT EMITTING DEVICE AND METHOD FOR PRODUCING THE SAME

FIELD OF THE INVENTION

The present invention relates to a long-life electroluminescent device having an organic layer capable of emitting light.

PRIOR ART

An electroluminescent device (EL), made in the form of a planar light emitting panel, has such advantages as high visibility, excellent display capability and high-speed response, and are used as light emitting displays and the backlight for liquid crystal displays.

Recently researches on organic light emitting devices made by using organic compounds as the constituent materials have been reported. For example, C. W. Tang and S. A. Van Slyke; Applied Physics Letters, Vol. 51, pp 913, 1987 discloses an organic light emitting device having such a configuration as organic light emitting layers and charge transporting layers are laminated between electrodes. In this work, a tris(8-quinolinol) aluminum complex (hereinafter referred to as Alq) was studied as a light emitting material and used as an excellent light emitting material having high light emission efficiency and high electron transporting capability.

C. W. Tang, S. A. Van Slyke and S. H. Chen; Journal of Applied Physics, Vol. 65, pp 3610, 1989 also reported that they made a light emitting device, which formed an organic light emitting layer, from Alq doped with a fluorescent pigment such as a coumarin derivative and DCM1, and found that the light emitting device changes the color of light emitted thereby when the pigment is appropriately chosen, and also that the light emission efficiency can be made higher than that of a non-doped light emitting layer.

Conventional organic light emitting devices are planar light emitting devices of laminated structure comprising a substrate, a positive electrode, organic charge transporting layers of a hole transporting layer and an electron transporting layer and a negative electrode. In this structure of the conventional light emitting device, the electron transporting layer also serves as a light emitting layer. There is known such a light emitting device in which a transparent electrode made of tin-indium oxide (ITO) is used as a positive electrode placed on a substrate made of a transparent glass, where the light is emitted from the positive electrode side of the glass substrate.

In the organic light emitting devices of the prior art, the hole transporting layer has been formed from triphenyldiamine (TPD), or its derivatives which have hole transporting property. Triphenyldiamine (TPD) carries holes in amorphous state.

Japanese Patent Publication No. 7-126615A discloses an organic light emitting device constituted with a novel tetraphenylbenzidine compound, triphenylamine trimer and benzidine dimer which are used as the material for forming a hole transporting layer.

Japanese Patent Publication No. 8-48656A discloses various tetraphenyldiamine derivatives and proposes to use these materials for the hole transporting layer to form an organic EL device. It is also described that the device can emit light over an elongated period of time when the electron transporting or hole transporting layer is doped with rubrene.

Such organic light emitting devices of the prior art as described above have life times of emitting light too short to be of practical use, and have not achieved the level of durability required of a display apparatus. Life time of light emission is determined by the following two factors. the first factor that determines the life is a decrease in the light emission efficiency in the organic charge transporting layer. This reduces the luminance as the duration of light emission increases. This problem takes place in the hole transporting layer. In the example described above, amorphous property of the TPD in the hole transporting layer deteriorate with time, resulting in lower light emission efficiency.

What is important for an organic layer constituting the light emitting device is that the organic thin film is amorphous in order to maintain highly efficient light emitting capability. When the device is driven to emit light, Joule heat which is generated heats up the light emitting device and causes the amorphous film which serves as the hole transporting layer to partially crystallize, thereby decreasing the capability to carry holes into the electron transporting layer, resulting in reduced amount of light emitted therein. While the glass transition temperature of the material is used as a measure indicating the stability of amorphous state, it is known that a high glass transition temperature is required for the amorphous state to be stable. Benzidine dimer, for example, which is disclosed as a material for forming the hole transporting layer in Japanese Patent Publication No. 7-126615A mentioned above, has a high glass transition temperature and therefore tends to maintain stability despite the Joule heat generated during operation or an increase in the surrounding temperature, but does not have sufficient stability to prevent the luminance from decreasing with time for practical applications.

In order to elongate the life time of such a light emitting device, it is necessary to use a material having a high glass transition temperature for higher stability of the amorphous thin film and improve the light emitting efficiency of the light emitting device and decrease the input power for the purpose of suppressing the heat generation from the light emitting device. Light emission efficiency herein refers to the efficiency of the light emitting power, not to the efficiency of current density. To meet the requirements described above, improvements are required to achieve light emission at a lower voltage and minimize the voltage increase over a long period of use, in case the device is supplied with a constant current to emit light.

The second factor that determines the life time of light emission in an organic light emitting device is the emergence of a non-illuminating portion in the light emitting surface which increases the area thereof with the period of light emission. The non-illuminating portion is primarily caused by the deterioration of the interface of laminated materials constituting the device. Such a defect is most likely to occur particularly in the interface between a transparent electrode formed as the positive electrode on a glass substrate and the hole transporting layer, resulting in the formation of black spots.

Second cause of the non-illuminating portion is a number of black spots generated in the hole transporting layer. The black spots increase the area thereof over the hole transporting layer as the duration of light emission increases, eventually darkening the entire light emitting surface.

As the non-illuminating portion in the interface gradually grows to the surrounding area, the intensity of light emission decreases in a portion where edges of segments of patterned ITO positive electrode make contact with the hole transporting layer. Close observation of the non-illuminating portion reveals that the region of the non-illuminating portion 21 increases toward the inside of an area where the positive electrode (transparent electrode) 4 and the negative electrode 3 opposes each other as shown in FIG. 4. The non-illuminating portion 21 has been observed to start on the edge of the transparent electrode and expand therefrom.

The black spots are caused by fine particles such as dust deposited on the interface of the transparent electrode or microscopic bumps of the electrode material. Dust and microscopic bumps on the transparent electrode cause the luminance in the surrounding area thereof to decrease and generate black spots which grow in such a way as a circular area of a number of black spots expands to darken the entire light emitting surface, thereby limiting the life of the light emitting device. Therefore, increasing the life time requires it to suppress the number and the growth of the black spots.

As described above, some defects in the interface of the ITO transparent electrode impede the injection of holes from the electrode into the hole transporting layer, and result in the generation of the non-illuminating portion. Experience shows that moisture on the ITO transparent electrode has a great influence on the non-illuminating portion. That is, deposition of moisture on the transparent electrode causes the deterioration leading to the generation and expansion of the black spots. Thus moisture deposited on the transparent electrode must be removed in order to prevent the non-illuminating portion from increasing.

SUMMARY OF THE INVENTION

An object of the present invention is to provide an organic light emitting device capable of emitting light for a longer period of time by preventing the light emission efficiency from decreasing due to an organic hole transporting layer with time, in order to solve the problems described above.

Another object of the present invention is to provide an organic light emitting device capable of emitting light for a longer period of time by preventing or postponing the formation of the non-illuminating portion in a positive electrode.

Further another object of the present invention is to provide a method for forming a positive electrode capable of preventing or postponing the formation of the non-illuminating portion in a positive electrode, and a method for producing an organic light emitting device having a long life time.

In the organic light emitting device of the present invention, with regards to the first factor which determines the life of the device, the hole transporting layer is formed from polyphenylamine having a high molecular weight as a major component to increase the glass transition temperature, thereby improving the stability of the amorphous state of the hole transporting layer. The hole transporting layer further includes a small amount of pigment compound as a dopant, which is a symmetric condensed polycyclic hydrocarbon that does not include substituent except for phenyl group, in order to improve the luminance of light emitted in the hole transporting layer and the light emission efficiency thereby to suppress the increase in the temperature of the device during light emission, so that the stability of amorphous state of the hole transporting layer is improved thereby solving the problem of short life due to the hole transporting layer which is the first determining factor.

More specifically, a triphenylamine tetramer represented by Formula 1 is used as the main component and a pigment compound of condensed polycyclic hydrocarbon as a dopant is a compound which contains no hetero-atom and a substituent except for benzene skeleton. Specifically, the pigment compound is 5,6,11,12-tetraphenylnaphthacene represented by Formula 2 or 9,10-diphenylanthracene represented by Formula 3.

According to the present invention, with regards to the second factor of determining the life time of the light emitting device, the positive electrode of the organic light emitting device is formed with a double-layer structure of transparent conductive oxide, thereby to stabilize the performance of injecting holes from the transparent electrode into the hole carrying material. That is, the first layer on the substrate is formed as a patterned electrode to use as a current distributing layer, and the second layer is formed on the first layer to obtain a uniform electrode covering over all the substrate to use as a hole injecting electrode in contact with the hole transporting electrode. The second layer is formed to cover the entire substrate surface including the first layer, so that the second layer insulates the hole transporting layer and suppresses the generation of non-illuminating portion, thereby elongating the life time of light emission.

The present invention provides a method for producing the organic light emitting device wherein the second layer of the positive electrode is formed by baking an oxide layer of indium or tin which is applied on the first layer, so that the second layer suppresses the generation of non-illuminating portion.

BRIEF DESCRIPTION OF THE DRAWINGS

The present invention will be described in detail with reference to the following accompanying drawings.

PREFERRED EMBODIMENTS OF THE INVENTION

Figure 1:
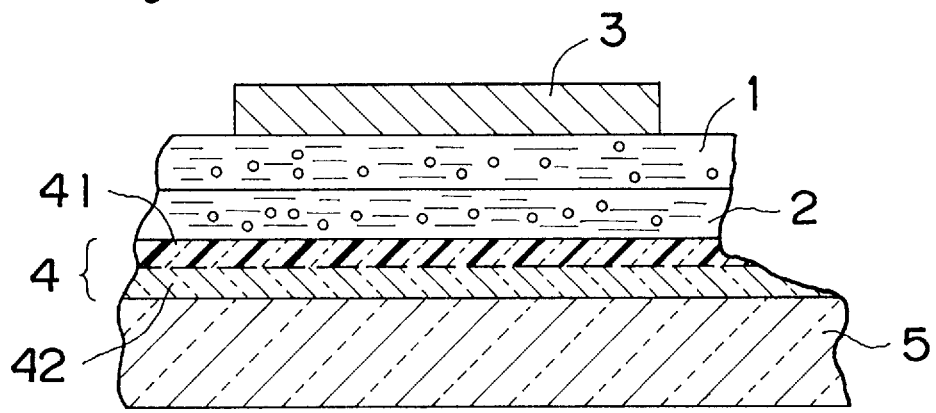
FIG. 1 is a schematic cross sectional view of an organic light emitting device according to one embodiment of the present invention.

According to the first embodiment of the present invention, an organic light emitting device is made by laminating a positive electrode, a hole transporting layer, an electron transporting layer and a negative electrode, wherein the hole transporting layer includes an organic compound, namely, triphenylamine tetramer represented by Formula 1 as the major component, and 5,6,11,12-tetraphenylnaphthacene represented by Formula 2 is used as pigment compound which is added to the hole transporting layer.

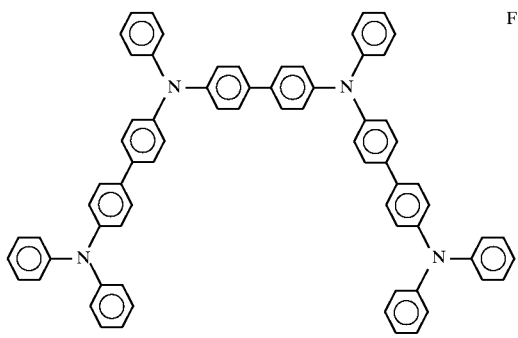

Formula 1

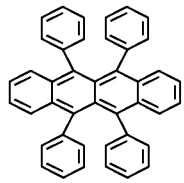

Formula 2

In the present invention, 9,10-diphenylanthracene represented by. Formula 3 may also be used as the organic pigment, instead of the compound of Formula 2.

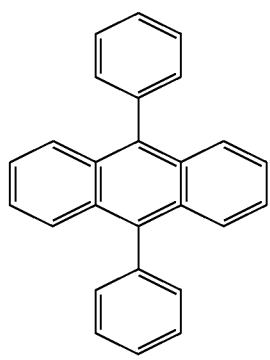

Formula 3

While the hole transporting layer of the organic light emitting device according to the present invention is formed as an amorphous thin film of the compound represented by Formula 1, the compound of Formula 1 has a structure of a triphenylamine tetramer of high molecular weight, and has high glass transition temperature (Tg) of 152° C. This makes it possible to increase the temperature at which the organic amorphous thin film crystallizes, thereby preventing it from crystallizing earlier and suppressing thermal degradation of the light emitting device.

The organic pigment represented by Formula 2 or Formula 3 is distributed throughout the hole transporting layer, so that the hole transporting layer emits light. Because these compound pigments have symmetrical molecular structures consisting only of benzene skeleton without any hetero atoms such as nitrogen and oxygen, these pigments do not have reaction sites where the pigment molecule interacts with other molecules included in the hole transporting layer. Thus an excited pigment molecule settles into the ground state without being deactivated from the excited state for light emission, and therefore the efficiency of light emission is high and the life time of the device is long, because there is no reaction path which leads to deactivation even when excited repeatedly. Such pigments as coumarin, DCM and quinacridone that have been used as dopants in the prior art are likely to form a complex or association with molecules which constitute the hole transporting layer or the electron transporting light emitting layer, resulting in reduced efficiency of light emission. However, use of the compound of Formula 2 or Formula 3 employed in the present invention causes the operating voltage required for the same level of luminance to decrease, and particularly improves the efficiency of light emission power, as well as improve the efficiency of light emission with regards to the current density. Increasing the power efficiency suppresses the temperature rise due to the Joule heat and the crystallization of the hole transporting layer caused thereby, thus making it possible to achieve stable light emission over a long period of time.

While black spots occurring in the hole transporting layer are caused by local crystallization of organic amorphous film, the compounds represented by Formula 2 and Formula 3 added as impurities have the effect of suppressing the crystallization. The compounds represented by Formula 2 and Formula 3 do not have the unnecessary reaction site as described above, and therefore have remarkable effect in preventing the crystallization without decreasing the hole mobility of triphenylamine tetramer.

In case the compound of Formula 1 alone is used to form a film by vapor deposition, many black spots originate from the hole transporting layer, causing the luminance of the light emitting surface to decrease as a whole. The black spots have been suppressed by means of heating the substrate during or after vapor deposition of the compound of Formula 1, in the prior art. But this resulted in a decrease in light emission efficiency because of contamination by heated organic material or the like. According to the present invention, it is shown that the addition of the pigment represented by Formula 2 or Formula 3 also decreases the generation of black spots.

Hence it is not necessary to laminate another transportation layer of such a material as polythiophene, which is described in Japanese Patent Publication No. 8-48656, on the positive electrode. The light emitting device of the present invention is capable of preventing the generation of black spots only by adding the pigment represented by Formula 2 or Formula 3 to the hole transporting layer which is made of the material represented by Formula 1, it is not necessary to laminate the hole transporting layer and heat the film, thus making it possible to simplify the producing process.

The organic pigment is added in the compound of Formula 1 in the amount of 0.1 to 10% by weight, as the main component. The amount of the organic pigment is preferably from 0.5 to 5% by weight in view of the luminance of light emission, voltage decrease and reduction in the number of black spots. The amount is most preferably in a range from 1.0 to 2.0% by weight.

Structure of the organic light emitting device applicable to the present invention is shown in FIG. 1. In FIG. 1, a substrate 5 is joined with a positive electrode 4 to support laminated layers, and is a transparent glass in this example which serves as a light emitting surface. The positive electrode 4 is formed on the substrate and serves as an electrode for injecting holes into the hole transporting layer 2. In this example, the so-called ITO transparent electrode made of tin oxide and indium oxide is used.

The hole transporting layer 2 is joined with the electron transporting layer 1 to carry the holes injected through the positive electrode (hole injecting electrode) to the interface with the electron transporting layer 1, and also serves as the light emitting layer in this invention.

The electron transporting layer 1 is a layer where electrons fed from the negative electrode 3 are selectively allowed to flow therein, and is made of aluminum quinoline as the most representative material. The negative electrode 3 is a metal electrode for injecting electrons into the electron transporting layer 1, and is made of a metal, for example Li/Al having a low value of work function.

The organic light emitting device according to the present invention may be manufactured, for example, by forming the transparent positive electrode 4 from ITO on the transparent glass substrate 5 by vapor deposition, sputtering or the like, and depositing a triphenylamine tetramer of Formula 1 and the pigment compound of Formula 2 or formula 3 on the positive electrode 4 at the same time by resistance heating or other heating process in vacuum, thereby forming the hole transporting layer 2 in the form of an amorphous thin film. The thickness of the hole transporting layer 2 is preferably from 40 to 200 nm. According to the present invention, the hole transporting layer 2 is used as light emitting layer.

The hole transporting layer 2 is further provided with the electron transporting layer formed thereon by resistive heat deposition of an electron transporting compound, for example tris(8-quinolinolato) aluminum complex (Alq). As the electron transporting layer, a thin film having a thickness of about 35 to 100 nm is employed. The hole transporting layer 2 is further provided with a film of metal such as Li/Al formed on the surface. According to the present invention, the electron transporting layer is preferably made of the organic compound represented by Formula 4.

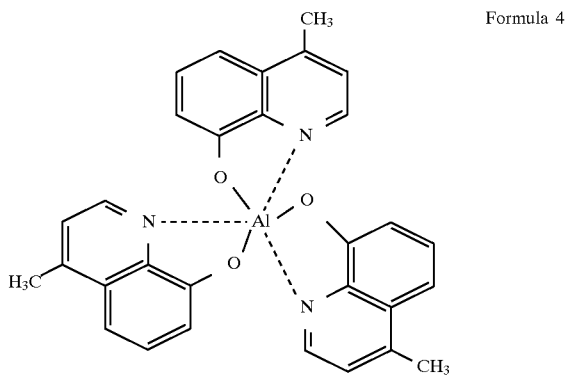

Formula 4

The compound represented by Formula 4 is obtained by substituting with methyl groups the 5-position of quinolinol as a ligand of an aluminum quinoline used generally as an electron transporting material. This substitution increases the electron density of oxygen and increases the probability of electron transition. Use of this material to make the electron transporting layer further improves the electron transporting property of the electron transporting layer and achieves further improvement in efficiency of light emitting power.

The light emitting device of the present invention described above may also be made by interposing a light emitting device 24, which includes an organic pigment of the desired color of light added thereto, between the hole transporting layer 2 and the electron transporting layer 1. For the light emitting layer 24, a pigment appropriate for the electron transporting material (compound of Formula 4) described above or for the material of the hole transporting layer of the present invention, for example, 5,6,11,12-tetraphenylnaphthacene can be used. Emission of light by this light emitting layer may also be used as well as the light emission by the hole transporting layer.

The organic light emitting layer 24 is made by depositing the compound of Formula 2 by resistance heating process at the same time the film of the main material is formed from the compound of Formula 4. The concentration of the compound of Formula 2 is preferably from 0.5 to 2.5% by weight, relative to the compound of Formula 4.

Example 1

An amorphous hole transporting layer 2 which was 60 nm thick was made from a positive electrode made by forming an ITO electrode film over the entire surface of a glass substrate and a film of the compound of Formula 2 together with the compound of Formula 1 by means of vapor-depositing on the positive electrode using resistance heating process in vacuum.

The concentration of the compound of Formula 2 was controlled within a range from 0 to 10% by weight of the compound of Formula 1. The electron transporting layer 1 was made by forming a film of the compound of Formula 4 by resistance heating process in vacuum to a thickness of 75 nm. Luminance, voltage and number of black spots, measured when Li/Al film was deposited to make a negative electrode and direct current of 5 mA/cm$^2$ was allowed to flow in the organic light emitting device, are shown in Table 1.

TABLE 1

| Concentration (% by weight) | Luminance of light emission (cd/m$^2$) | Voltage (V) | Number of black spots (mm$^{-2}$) |
|---|---|---|---|
| 0 | 170 | 8.2 | 1139 |
| 1.4 | 270 | 3.5 | 9.5 |
| 2.4 | 200 | 4.6 | 42 |
| 4.5 | 180 | 4.8 | 14 |
| 9.8 | 100 | 5.6 | 22 |

Current density: 5mA/cm$^2$

Result given in Table 1 shows that the efficiency of light emission power was improved in a low concentration region of the pigment compound in the range from 0.1 to 4.5% by weight, while the operating voltage and the number of black spots were improved in a wider range of high concentration side from 0.5 to 10% by weight.

Therefore, the concentration is preferably from 0.5 to 4.5% by weight in order to obtain better results in all of luminance, voltage and number of black spots, and most preferably from 1.0 to 2.5% by weight.

Example 2

In Example 2, the organic light emitting device was made similarly to the first embodiment, except for using the compound of Formula 3 instead of the compound of Formula 2, and showed similar characteristics upon evaluation.

Example 3

Figure 2:
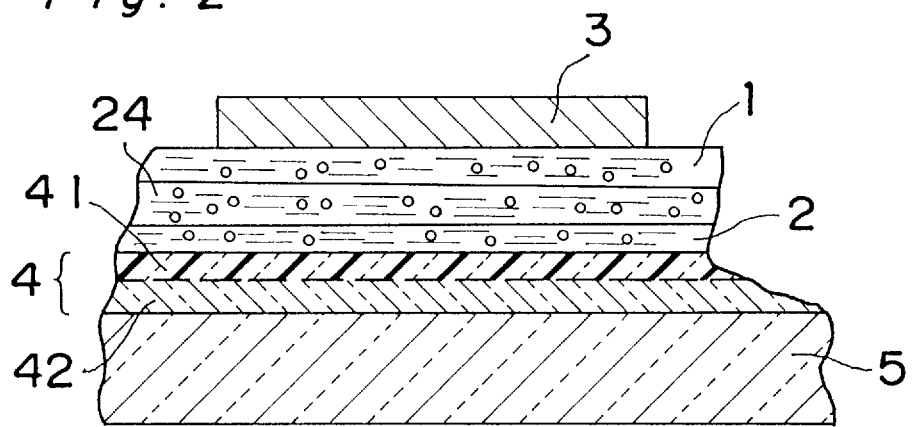
FIG. 2 is a drawing similar to FIG. 1 showing the organic light emitting device according to one embodiment of the present invention.

Example 3 is another configuration of the organic light emitting device wherein the light emitting layer 24 is interposed between the electron transporting layer 1 and the hole transporting layer 2. FIG. 2 shows the structure of the light emitting device. On a substrate having an ITO transparent electrode formed thereon, the hole transporting layer 2 was formed to a thickness of 40 nm by depositing the compound of Formula 2, doped with the compound of Formula 3 in 1.5% by weight, in vacuum by resistance heating technique. Then the organic light emitting layer 24 was formed by doping the compound of Formula 4 with the compound of Formula 2. Then after forming the electron transporting layer 1 of thickness 40 nm from the compound of Formula 4, Al/Li electrode of a thickness 200 nm was provided as the negative electrode 3.

In the organic light emitting device, the hole transporting layer 2 is made mainly of the compound of Formula 1 which is formed along with the compound of Formula 2 at the same time through deposition by resistance heating technique. Concentration of the compound of Formula 2 was set to 1.5% by weight that of the compound of Formula 1.

In the organic light emitting device of this Example, concentration of the compound of Formula 2 included in the organic light emitting layer 24 was set to 1.5% by weight, and direct or alternate external voltage was applied across the transparent electrode 4 and the electron injecting metal electrode 3. When direct-current voltage of 5 V was applied to the organic light emitting device of the third embodiment, current density exceeded 35 mA/cm$^2$ and luminance of about 2000 cd/m$^2$ was obtained.

According to the second embodiment of the present invention, the organic light emitting device has a laminated structure comprising the positive electrode, the hole transporting layer, the electron transporting layer and the negative electrode formed on the transparent substrate, wherein the positive electrode has a double layer structure, with the first layer on the glass substrate side being a patterned layer which has the function of distributing current, and the second layer on the hole transporting layer side having the function of injecting holes to the hole transporting layer on the front side of the substrate.

This structure is particularly suitable for making the positive electrode in the form of patterned transparent electrode on the substrate. The positive electrode of the organic light emitting device of the present invention is made in double layer structure of a transparent conductive oxide, wherein the first transparent electrode is a current distributing layer formed by patterning and the second layer covers the entire current distributing layer. The second layer which covers the entire surface has the function of injecting holes into the hole transporting layer by means of the current flowing therein from the first layer and the function of completely shutting moisture off the hole transporting layer. This makes it possible to prevent the generation of non-illuminating portion in the interface between the positive electrode and the hole transporting layer, and stabilize the hole injecting function of the second layer.

FIG. 1 shows the structure of the positive electrode, wherein a current distributing layer 42 is formed on the substrate 5 as the first layer and a hole injecting electrode layer 41 is formed thereon as the second layer which serves as the positive electrode 4, while the hole transporting layer is formed on the hole injecting electrode layer 41.

Figure 3:
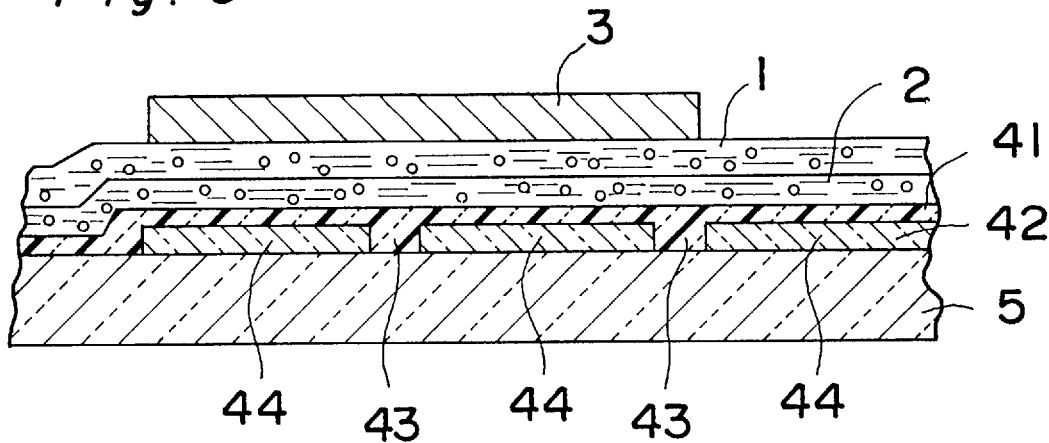
FIG. 3 is a more specific schematic cross sectional view of an organic light emitting device according to one embodiment of the present invention.
Figure 4:
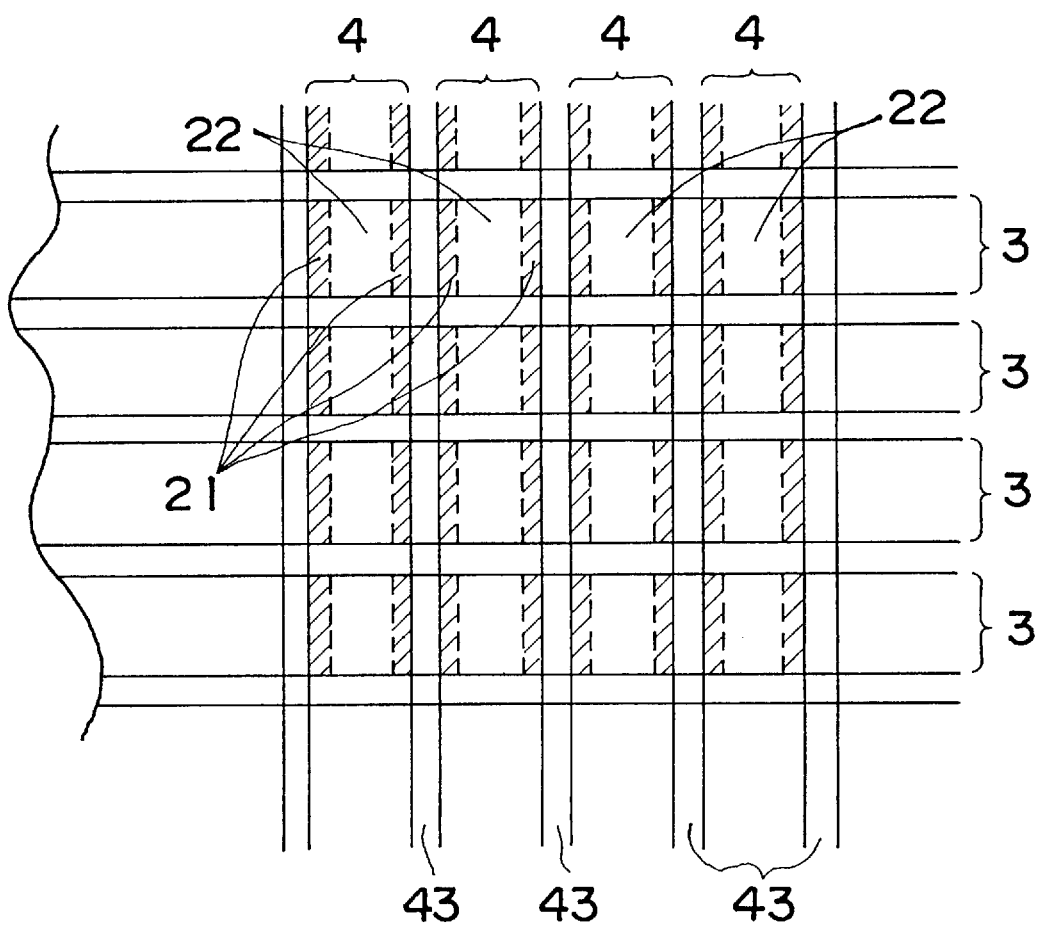
FIG. 4 is a schematic overview of an organic light emitting device panel provided with a glass substrate and a transparent positive electrode. Non-illuminating portion of the positive electrode is indicated by hatching in this drawing.

FIG. 3 shows an example of applying the present invention to a patterned transparent electrode, wherein the current distributing layer 42 is formed as a patterned first layer which has slits 43 made therein at intervals to separate the current distributing layer 42 into a number of segments 44. The hole injecting electrode layer 41 of the second layer covers the current distributing layer 42 on the substrate, filling the slits 43 between the segments, while the electrode layer 41 separates the first layer and covers the entire top surface of the substrate. With this configuration, because the second layer is in contact with the hole transporting layer and prevents the interface defects from intruding therein, occurrence of non-illuminating portion is prevented and the light emission efficiency can be maintained over a longer period of time.

According to the present invention, the positive electrode is made such as the second layer substantially comprises indium oxide or tin oxide alone. Use of a single oxide is advantageous for injecting holes because work function of 4.0 eV or higher, particularly 4.7 eV can be ensured in the case of indium oxide.

A film made of indium oxide or tin oxide alone has a high specific resistivity, and therefore is capable of forming a film having a higher resistance than the first layer. The film made of indium oxide or tin oxide alone may include a small amount of chemical element which increases the electrical resistance such as chlorine.

The film made of indium oxide or tin oxide alone is preferably formed by baking a applied film of chloride of an organic metal such as organic indium or tin. In this case, as will be described later, it is preferable that a solution of the organic metal chloride be applied on the ITO film patterned on the substrate as the first layer, and the film be dried and heated to form a baked coat.

The second layer can be made thinner than the first layer. The second layer of the positive electrode is preferably less than 0.1 $\mu$m, which decreases the electrical resistance in the direction of thickness. The second layer can easily supply the current from the first layer as holes into the hole transporting layer. On the other hand, because the second layer is made in a thin film having a high resistance in the direction of plane, insulation between adjacent segments in the first layer is maintained.

The second layer has a resistance per unit area preferably in a range of 1 k$\Omega$/□ to 10 k$\Omega$/□, and the first layer has a resistance per unit area preferably in a range from 10 to 100 $\Omega$/□.

The first layer is made in a film having a lower resistance than that of the second layer. For this purpose, one or more sorts selected from indium oxide, tin oxide, antimony oxide and zinc oxide are used to form the first layer of which resistance is controlled to be lower than that of the second layer. Conventional ITO electrode can be used for this.

The first layer may be a film made of a metal, and the second layer has transparency to light. The metal film, even when it is opaque, is formed in thin strips separated by wider slots by patterning. Because the entire surface of the metal film is covered by the second layer, light is emitted between the second layer and the opposing negative layer, and light which has transmitted through the slots is directed toward the substrate.

The third embodiment of the present invention is a method for producing the organic light emitting device characterized by the method of forming the positive electrode on the substrate.

This producing method comprises the steps of forming the first layer in a desired pattern on the substrate, applying a compound of organic indium or organic tin doped with some chloride on the first layer to cover the entire substrate, and heating the applied film to a temperature from 400° to 600° C. to bake the second layer, thereby forming the positive layer.

Black spots are mainly caused by moisture, which is deposited on the ITO transparent electrode or has diffused from the surface of the ITO transparent electrode to the inside, thereby causing a chemical reaction such as electrolysis with the hole transporting layer and eventually impeding the holes from moving in the interface with the hole transporting layer. Such an interface deterioration can be prevented by preventing the moisture from depositing or diffusing. The ITO transparent electrode 4 cannot be free from deposition of moisture, because of fine patterning by wet process.

In the producing method of the present invention, there is an effect of preventing the interface between the positive electrode and the hole transporting layer from deteriorating due to moisture by removing the moisture from the first layer and the second layer, through the formation of at least the hole injecting electrode layer 41 (second layer) by baking.

The hole injecting electrode layer 41 which is the second layer of the positive electrode 4 is made by applying a solution of organic indium chloride or organic tin chloride on the first layer provided on the substrate to form a coat, drying the coat and baking the coat along with the substrate, thereby to turn the coat into an oxide film having a smooth surface. Baking temperature is from 400° to 600° C. and preferably from 450° to 550° C. At a temperature below 400° C., the chloride of organic metal cannot be fully decomposed and oxidized. At a temperature above 600° C., the glass substrate may deform.

While the ITO transparent electrode generally utilizes a low electrical resistance, the first layer 42 preferably has a low resistance and therefore may be formed by the conventional process. The material used may be one or more selected from among indium oxide, tin oxide, antimony oxide and zinc oxide. The first layer is formed by sputtering, electron beam deposition or the like on the glass substrate, followed by heat treatment. Patterning can be performed during such a deposition process. In case sputtering or electron beam deposition is employed, the electrode surface of the first layer becomes rough which, when used as it is, accelerates the occurrence of black spots. The second layer 41, being coated, is effective in reducing the surface unevenness.

The second layer 41 is made by applying a solution of organoindium chloride or organotin chloride to form a thin film covering the entire surface of the first layer which has been formed as described above, then baking the film to form a coat of indium oxide or tin oxide. With this process, because indium oxide and tin oxide have high values of electrical resistance, resistance of the second layer can be made higher. High electrical resistance makes it possible to ensure the insulation between the patterns of the first layer 42.

According to this embodiment described above, making the positive electrode, which is the transparent electrode of the organic light emitting device in double layer structure, makes it possible to eliminate the influence of moisture on the hole transporting layer. Thus the function of injecting holes from the transparent electrode into the hole transporting layer can be stabilized, making it possible to maintain the light emission efficiency over a longer period of time and reduce the number of black spots generated and the rate at which the black spots expand.

The electrode of the first layer of the transparent electrode which has the double layer structure may be made by spraying a solution of indium chloride and baking the film in oxidizing atmosphere, followed by patterning. Furthermore, the second layer may be made by applying an organometallic metal (indium or tin) chloride solution thereon and baking the film at high temperature of 400° to 600° C., as described above. It may be made by baking at higher temperature of 450° to 650° C., preferably.

We claim:

1. An organic light emitting device, comprising a positive electrode, a hole transporting layer, an electron transporting layer and a negative electrode, wherein the hole transporting layer is formed with an organic compound represented by the following Formula 1, and a organic pigment compound of 0.1 –10% by weight represented by the following Formula 2 is added into the hole transporting layer:

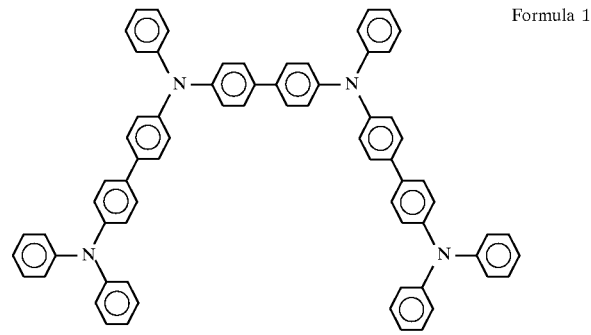

Formula 1

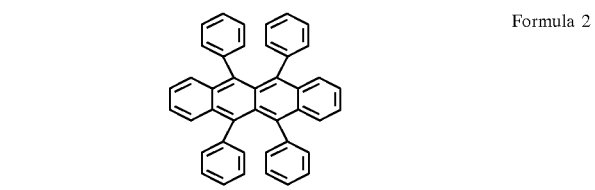

Formula 2

2. An organic light emitting device according to claim 1, wherein the organic pigment compound is an organic pigment compound represented by the following Formula 3 in place of Formula 2:

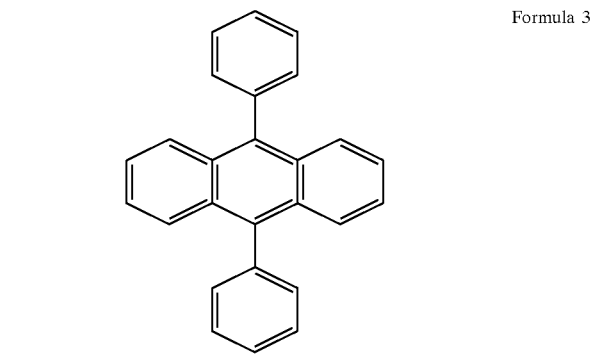

Formula 3

3. An organic light emitting device according to claim 1, wherein the electron transporting layer is formed with an organic compound represented by the following Formula 4:

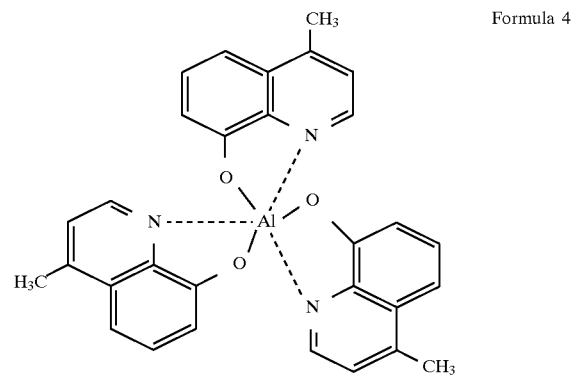

Formula 4

4. An organic light emitting device according to claim 1, wherein said organic light emitting device is laminated in which a light emitting layer in which an organic pigment compound is added is interposed between the hole transporting layer and the electron transporting layer.

* * * * *